(12) United States Patent
Tae

(10) Patent No.: US 9,373,670 B2
(45) Date of Patent: Jun. 21, 2016

(54) ORGANIC LIGHT-EMITTING DISPLAY APPARATUS AND PHOTOMASK FOR MANUFACTURING THE SAME

(71) Applicant: SAMSUNG DISPLAY CO., LTD., Yongin, Gyeonggi-Do (KR)

(72) Inventor: Seung-Gyu Tae, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/314,332

(22) Filed: Jun. 25, 2014

(65) Prior Publication Data

US 2015/0069348 A1 Mar. 12, 2015

(30) Foreign Application Priority Data

Sep. 6, 2013 (KR) .................. 10-2013-0107505

(51) Int. Cl.
 *H01L 27/32* (2006.01)
 *G03F 1/00* (2012.01)
(52) U.S. Cl.
 CPC .............. *H01L 27/3262* (2013.01); *G03F 1/00* (2013.01); *H01L 27/3265* (2013.01)
(58) Field of Classification Search
 CPC ............ H01L 27/3262; H01L 27/3265; H01L 27/3258; G03F 1/00
 See application file for complete search history.

(56) References Cited

U.S. PATENT DOCUMENTS

| 2005/0179036 A1 | 8/2005 | Yamazaki et al. |
| 2006/0145601 A1 | 7/2006 | Kim |
| 2008/0129664 A1 * | 6/2008 | Lin et al. .................. 345/87 |
| 2011/0057195 A1 | 3/2011 | Yin et al. |
| 2011/0169001 A1 | 7/2011 | Ozeki et al. |
| 2014/0034923 A1 | 2/2014 | Kim et al. |
| 2014/0332761 A1 | 11/2014 | Kim |

FOREIGN PATENT DOCUMENTS

| JP | 2005-260216 A | 9/2005 |
| KR | 10-2006-0077963 A | 7/2006 |
| KR | 10-2010-0069963 A | 6/2010 |
| KR | 10-2011-0083511 A | 7/2011 |
| KR | 10-1176540 B1 | 8/2012 |
| KR | 10-2014-0018623 A | 2/2014 |
| KR | 10-2014-0133339 A | 11/2014 |

* cited by examiner

*Primary Examiner* — Whitney T Moore
(74) *Attorney, Agent, or Firm* — Lee & Morse, P.C.

(57) ABSTRACT

A semiconductor device includes a semiconductor layer over a substrate. The semiconductor layer changes direction at least twice and has at least two different widths in the same plane. The length of a current path through the semiconductor layer is greater than a shortest path through the semiconductor layer in the same plane.

13 Claims, 10 Drawing Sheets

ORGANIC LIGHT-EMITTING DISPLAY APPARATUS AND PHOTOMASK FOR MANUFACTURING THE SAME

CROSS-REFERENCE TO RELATED APPLICATION

Korean Patent Application No. 10-2013-0107505, filed on Sep. 6, 2013, and entitled "Organic Light-Emitting Display Apparatus and Photomask For Manufacturing The Same," is incorporated by reference herein in its entirety.

BACKGROUND

1. Field

One or more embodiments described herein relate to a display apparatus.

2. Description of the Related Art

Various display apparatuses use thin-film transistors (TFTs), capacitor, and associated wiring to display images. Examples of these apparatuses include but are not limited to organic light-emitting diode (OLED) display apparatus and liquid crystal display (LCD) apparatuses.

During manufacture, a substrate is formed to include fine patterns that include complex connections among the TFTs, capacitors, and wiring. The demand for higher resolution displays and compact displays for use in smaller portable devices has made space efficiency a goal for product designers.

SUMMARY

In accordance with one embodiment, a display apparatus includes a switching thin-film transistor (TFT) on a substrate and connected to a scan line and a data line, a driving TFT connected to the switching TFT, and a display device connected to the driving TFT. The driving TFT includes a driving semiconductor layer includes a first region extending in a first direction, a first curved portion curved at an end of the first region and which changes direction, a second region extending in a second direction and having an end connected to the first curved portion, a third region extending in the second direction, a second curved portion curved at an end of the third region and which changes direction, a fourth region extending in the first direction and having an end connected to the second curved portion, and a connecting region to connect the second and third regions, and wherein widths of the second and third regions are narrower than widths of the first and fourth regions.

Also, the widths of the first and fourth regions may be substantially equal. The widths of the second and third regions may be substantially equal. The connecting region may include a region extending in the first direction. The connecting region may extend to form an obtuse angle relative to each of the second and third regions.

Also, each of the first and second curved portions may include an inner corner corresponding to an outer corner, and a radius of curvature of the outer corner is greater than a radius of curvature of the inner corner.

Also, a width of the connecting region may be substantially equal to the widths of the first and fourth regions. A width of the connecting region may be substantially equal to widths of the second and third regions. Lengths of the first and fourth regions may be longer than lengths of the second and third regions.

Also, the apparatus may include a first semiconductor pattern connected to another end of the first region and extending in the second direction, and a second semiconductor pattern connected to another end of the fourth region and extending in the second direction. A distance between the first semiconductor pattern and the third region may be substantially equal to a distance between the second semiconductor pattern and the second region.

Also, the apparatus may include a first insulating film on the substrate and overlapping the driving semiconductor layer, and a capacitor on the first insulating film and overlapping the driving semiconductor layer. The capacitor may include a first electrode on the first insulating film, overlapping the driving semiconductor layer, and performing functions of a driving gate electrode; a second insulating film overlapping the first electrode; and a second electrode on the second insulating film and overlapping the first electrode. The display device may be an organic light-emitting device which includes an organic emission layer between first and second electrodes.

In accordance with another embodiment, a photomask for manufacturing a display apparatus includes a switching opening pattern corresponding to a switching semiconductor layer, and a driving opening pattern connected to the switching opening pattern and corresponding to a driving semiconductor layer. The driving opening pattern includes a first region extending in a first direction, a first corner portion connected to an end of the first region and which changes direction, a second region extending in a second direction and having an end connected to the first corner portion, a third region extending in the second direction, a second corner portion connected to an end of the third region and which changes a direction, a fourth region extending in the first direction and having an end connected to the second corner portion, and a connecting region to connect the second region and the third region. Widths of the second and third regions are narrower than widths of the first and fourth regions.

Also, the connecting region may include a region extending in the first direction. The connecting region may be at an obtuse angle relative to each of the second and third regions. Each of the first and second corner portions may include an inner corner corresponding to and outer corner, and the outer corner is chamfered.

Also, the widths of the second and third regions may be substantially equal. The connecting region may have a width that is substantially equal to the widths of the second and third regions.

In accordance with another embodiment, a semiconductor device includes a substrate, and a semiconductor layer over the substrate, wherein the semiconductor layer changes direction at least twice and has at least two different widths in a same plane, and wherein a length of a current path through the semiconductor layer is greater than a shortest path in the same plane.

Also, the semiconductor layer may have at least three segments, a second segment is between first and third segments, and a width of the second segment is different from widths of the first and third segments. The width of the second segment may be less than widths of the first and third segments.

Also, the first and third segments extend in a first direction, and the second segment extends in a second direction. The first direction may be substantially perpendicular to the second direction. The semiconductor layer may have a rounded corner in the same plane. The semiconductor layer may be included in a pixel of in an image display area.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
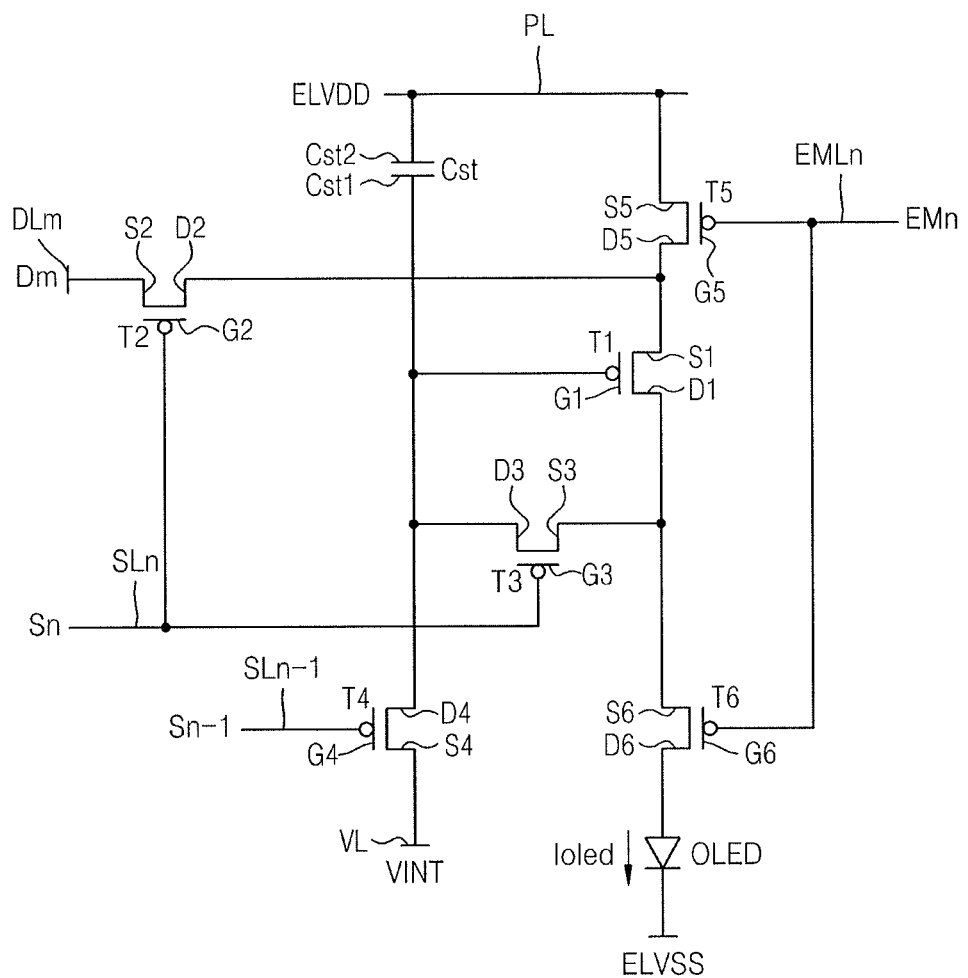
FIG. 1 illustrates an embodiment of a pixel in an OLED apparatus.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The drawings discussed below include a 6Tr-1Cap structure active matrix (AM) type organic light-emitting display apparatus. In this apparatus, six thin-film transistors (TFT) and one capacitor is included in one pixel. Accordingly, a display apparatus may be formed to include a plurality of TFTs and at least one capacitor for one pixel, and/or may include additional wiring. A pixel may be considered to be a unit for displaying an image. In one embodiment, each pixel includes a plurality of sub-pixels. In other embodiments, the pixel may be the minimum unit for displaying an image. A display apparatus, thus, displays images using a plurality of pixels.

FIG. 1 illustrates an embodiment of a pixel in an organic light-emitting display apparatus. The organic light-emitting display apparatus includes a display region for displaying an image and a peripheral region disposed around the display region. The display region and the peripheral region are defined on a substrate. A plurality of pixels emitting light and a plurality of wirings applying an electric signal to drive each pixel are disposed in the display region.

As illustrated in FIG. 1, the wirings may include, for example, scan lines SLn and SLn-1 for transmitting scan signals Sn and Sn-1, a data line DLm for transmitting a data signal Dm, and a driving voltage line PL for transmitting a driving voltage ELVDD. The wirings may further include an initialization voltage line VL for transmitting an initialization voltage VINT, and an emission control line EMLn for transmitting an emission control signal EMn. Pixels are disposed at respective locations where a plurality of wirings extending in a first direction and a plurality of wirings extending in a second direction cross each other.

Each pixel includes an organic light-emitting device emitting light and a pixel circuit for driving the organic light-emitting device. The pixel circuit drives the device, at least in part, based on signals received from the wirings. In one example application, the pixel circuit includes at least two TFTs and at least one capacitor. Alternatively, as shown in FIG. 1, the pixel circuit may include six TFTs and one capacitor. In other embodiments, a different number of transistors, capacitors, and/or wirings may be included, In the pixel circuit of FIG. 1, the TFTs includes a driving TFT T1, a switching TFT T2, a compensating TFT T3, an initialization TFT T4, an operation control TFT T5, and an emission control TFT T6.

A gate electrode G1 of the driving TFT T1 is connected to a first capacitor electrode Cst1 of a storage capacitor Cst. A source electrode S1 of the driving TFT T1 is connected to the driving voltage line PL through operation control TFT T5. A drain electrode D1 of the driving TFT T1 is electrically connected to an anode of an organic light-emitting device OLED through emission control TFT T6. The driving TFT T1 receives data signal Dm according to a switching operation of the switching TFT T2, to supply a driving current Ioled to the organic light-emitting device OLED.

A gate electrode G2 of the switching TFT is connected to the scan line SLn and a source electrode S2 of the switching TFT T2 is connected to the data line DLm. A drain electrode D2 of the switching TFT T2 is connected to the source electrode S1 of the driving TFT T1, while also being connected to the driving voltage line PL through the operation control TFT T5. The switching TFT T2 performs a switching operation of transmitting the data signal Dm received from the data line DLm to the source electrode S1 of the driving TFT T1 by being turned on according to the scan signal Sn received through the scan line SLn.

A gate electrode G3 of the compensating TFT T3 is connected to the scan line SLn. A source electrode S3 of the compensating TFT T3 is connected to a drain electrode D1 of the driving TFT T1, while also being connected to the anode of the organic light-emitting device OLED through the emission control TFT T6. A drain electrode D3 of the compensating TFT T3 is connected to the first capacitor electrode Cst1 of the storage capacitor Cst, a drain electrode D4 of the initialization TFT T4, and the gate electrode G1 of the driving TFT T1. The compensating TFT T3 is turned on according to the scan line Sn received through the scan line SLn. When turned on, the compensating TFT T3 connects the gate and drain electrodes G1 and D1 of the driving TFT T1, thereby diode-connecting the driving TFT T1 to compensate for a threshold voltage of the driving TFT T1.

A gate electrode G4 of the initialization TFT T4 is connected to the scan line SLn-1 and a source electrode S4 of the initialization TFT T4 is connected to the initialization voltage line VL. The drain electrode D4 of the initialization TFT T4 is connected to the first capacitor electrode Cst1 of the storage capacitor Cst, the drain electrode D3 of the compensating TFT T3, and the gate electrode G1 of the driving TFT T1. The initialization TFT T4 performs an initialization operation which includes initializing a voltage of the gate electrode G1 of the driving TFT T1. This may be performed by coupling initialization voltage VINT to the gate electrode G1 of the driving TFT T1. The initialization TFT T4 is turned on according to the scan signal Sn-1 received through the scan line SLn-1.

A gate electrode G5 of the operation control TFT T5 is connected to the emission control line EMLn. A source electrode S5 of the operation control TFT T5 is connected to the driving voltage line PL, and a drain electrode D5 of the operation control TFT T5 is connected to the source electrode S1 of the driving TFT T1 and the drain electrode D2 of the switching TFT T2. The operation control TFT T5 is between the driving voltage line PL and the driving TFT T1. The operation control TFT T5 is turned on according to the emission control signal EMn received from the emission control line EMLn, for the purpose of coupling driving voltage ELVDD to the driving TFT T1.

A gate electrode G6 of the emission control TFT T6 is connected to the emission control line EMLn. A source electrode S6 of the emission control TFT T6 is connected to the drain electrode D1 of the driving TFT T1 and the source electrode S3 of the compensating TFT T3. A drain electrode D6 of the emission control TFT T6 is electrically connected to the anode of the organic light-emitting device OLED. The emission control TFT T6 is between the driving TFT T1 and the organic light-emitting device OLED. The emission control TFT T6 is turned on according to the emission control signal EMn received through the emission control line EMLn. When turned on, the emission control TFT T6 transmits the driving voltage ELVDD from the driving TFT T1 to the organic light-emitting device OLED.

The operation control TFT T5 and emission control TFT T6 are simultaneously turned on according to the emission control signal EMn received through the emission control line EMLn. When turned on, the driving voltage EVLDD is reaches the organic light-emitting device OLED. As a result, the driving current Ioled flows through the organic light-emitting device OLED.

A second capacitor electrode Cst2 of the storage capacitor Cst is connected to the driving voltage line PL. A cathode of the organic light-emitting device OLED is connected to a common voltage ELVSS. Accordingly, the organic light-emitting device OLED displays an image by receiving the driving current Ioled from the driving TFT T1 and emitting light.

Figure 2:
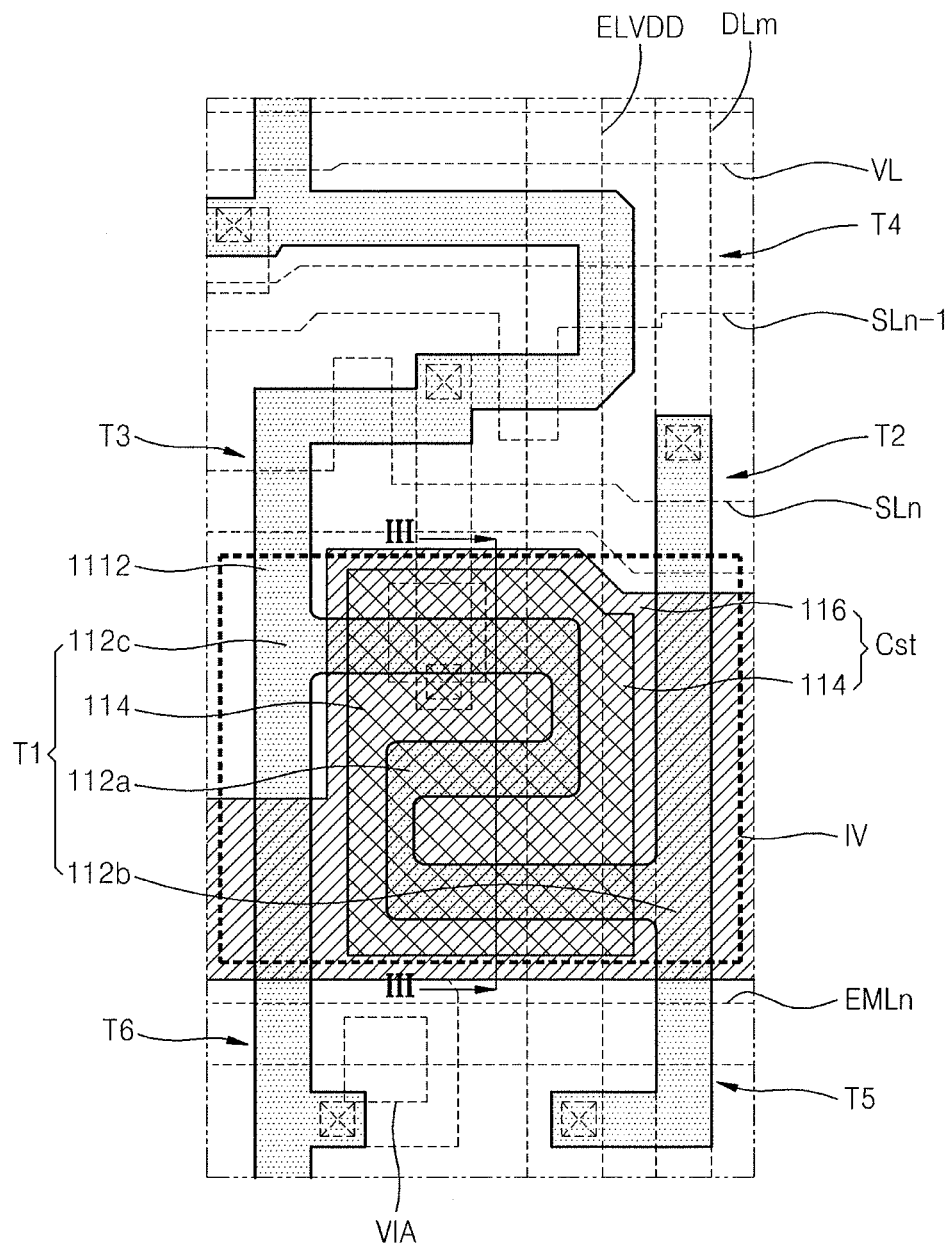
FIG. 2 illustrates a plan view of the pixel.
Figure 3:
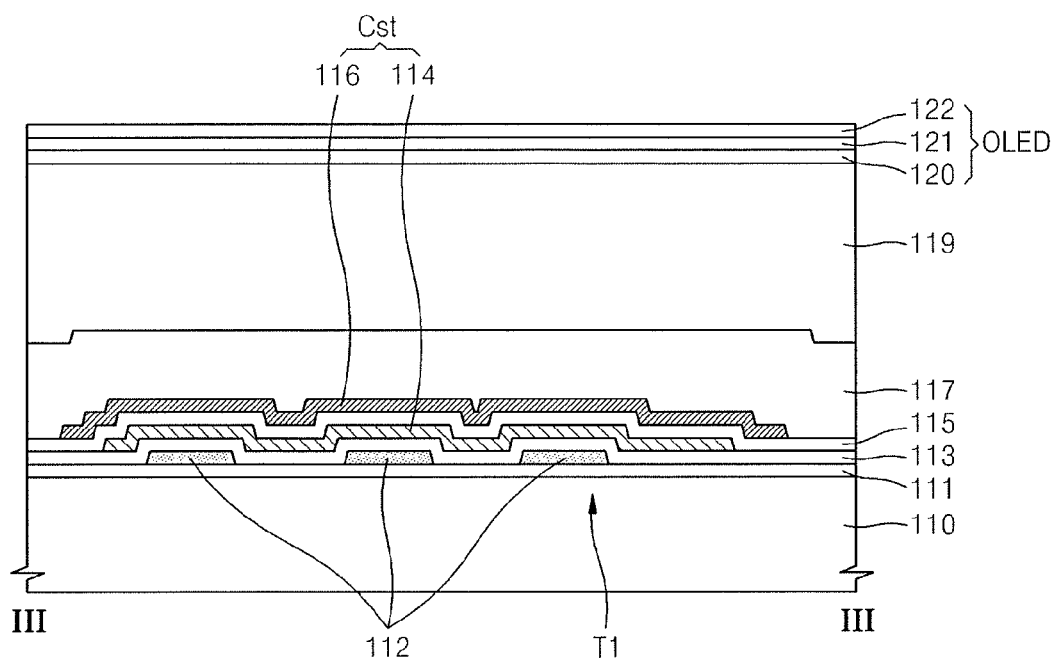
FIG. 3 illustrates a view taken along a section line in FIG. 2.

FIG. 2 illustrates a plan view of the pixel of FIG. 1, and FIG. 3 illustrates a cross-sectional view taken along a line III-III of FIG. 2. Referring to FIGS. 2 and 3, a semiconductor layer 1112 curved in various ways is disposed on a substrate 110. The semiconductor layer 1112 may include a semiconductor material such as poly-silicon, and may include a channel region on which an impurity is not doped. Source and drain regions may be disposed on respective sides of the channel region in areas on which impurities are doped.

A buffer layer 111 for preventing penetration of impure elements and flattening a surface may be disposed between the substrate 110 and the semiconductor layer 1112.

The semiconductor layer 1112 may include a driving semiconductor layer 112 in the driving TFT T1 and a switching semiconductor layer in the switching TFT T2. In FIG. 3, only the driving semiconductor layer 1112 is illustrated.

The driving semiconductor layer 112 may include a driving channel region 112a. A driving source region 112b and a driving drain region 112c are respectively formed on ends of the driving channel region 112a. In order to lengthen the driving channel region 112a in a small space, the driving channel region 112a may have a curved shape such as "ㄹ" with curved portions.

A first insulating layer 113 is disposed on the substrate 110 to cover the semiconductor layer 1112. The first insulating layer 113 may be a multilayer or single layer thing film including inorganic or organic material.

A driving gate electrode 114 is disposed in a region corresponding to the driving semiconductor layer 112 on the first insulating layer 113. The driving gate electrode 114 may operate as the first capacitor electrode Cst1 of the storage capacitor Cst, and therefore may be referred to as the first capacitor electrode 114.

The storage capacitor Cst includes the first capacitor electrode 114 and a second capacitor electrode 116. The second capacitor electrode Cst2 is disposed on a second insulating layer 115. The capacitance of the storage capacitor Cst is determined based on an area of a region in which the first and second capacitor electrodes 114 and 116 overlap, and also based on a dielectric constant of the second insulating layer 115.

The driving semiconductor layer 112 has curved portions to increase the length of the driving channel region 112a. The storage capacitor Cst may have sufficient capacitance at high resolution by forming the storage capacitor Cst to overlap the driving semiconductor layer 112, to thereby form a region for the storage capacitor Cst reduced by the driving semiconductor layer 112.

A third insulating layer 117 is disposed on the second insulating layer 115 to cover the second capacitor electrode 116, the data line DLm is disposed on the third insulating layer 117, and a fourth insulating layer 119 is disposed on the third insulating layer 117 to cover the data line DLm.

A first electrode 120, an organic emission layer 121, and a second electrode 122 of the organic light-emitting device OLED are disposed on the fourth insulating layer 119. At least one of a hole injection layer, a hole transport layer, an electron transport layer, or an electron injection layer may be disposed between the first and second electrodes 120 and 122, as well as the organic emission layer 121. Also, other function layers may be disposed between the first and second electrodes 120 and 122.

The first electrode 120 of the organic light-emitting device OLED may be electrically connected to the driving TFT T1 through a via hole VIA shown in FIG. 2.

When the organic light-emitting device OLED is a full color organic light-emitting device OLED, the organic emission layer 121 may be patterned to correspond to a red emission layer, a green emission layer, and a blue emission layer, respectively, according to a red sub-pixel, a green sub-pixel, and a blue sub-pixel.

The organic emission layer 121 may have a multilayer structure, in which a red emission layer, a green emission layer, and a blue emission layer are stacked on each other. Alternatively, the organic emission layer 121 may have a single-layer structure including a red emission layer, a green emission layer, and a blue emission layer to emit white light. The organic light-emitting device OLED including organic emission layer 121 may further include a red color filter, a green color filter, and a blue color filter to display full color.

As previously indicated, the driving semiconductor layer 112 has curved portions to increase the length of the driving channel region 112a in a small space. The curved portions may cause the driving semiconductor layer to form various curved patterns. An example of one curved pattern has a shape of "ㄹ." In other embodiments, the driving semiconductor layer may have a different curved pattern with a fewer or greater number of curves.

Because the driving channel region 112a of the driving semiconductor layer 112 may be long, a driving range of a gate voltage applied to the driving gate electrode 114 may be increased. Since the driving range of the gate voltage is increased, a gray scale value of light emitted from the organic light-emitting device OLED may be more precisely controlled by changing the gate voltage. Thus, the resolution and display quality of the organic light-emitting display apparatus may be increased.

The driving semiconductor layer 112 including the semiconductor layer 1112 may be formed, for example, using a photolithography method. In such a method, the semiconductor layer 1112 that needs to be patterned is formed throughout the substrate 110. Then, a photoresist having a photosensitive property is formed on the semiconductor layer 1112. Then, a photomask having a desired pattern is disposed and exposed to light, so that the photoresist has the desired pattern corresponding to the photomask. Next, the remaining pattern of the photoresist is used as a mask to etch the semiconductor layer 1112, to thereby form a pattern or shape of the driving semiconductor layer 112.

A pattern having a complex shape which includes curved portions, such as may correspond to the driving semiconductor layer 112, may be difficult to form during a photolithography process, for example, due to reflow, an exposure amount error, and an etching error of a photoresist. In other words, the final product formed by this process may not be uniform due to process variations (e.g., process dispersions) generated during a photolithography process.

Moreover, when the resolution of the organic light-emitting display apparatus is to be increased, a left and right width of a pixel may be decreased. Thus, a space where the driving semiconductor layer 112 may be limited.

Figure 13:
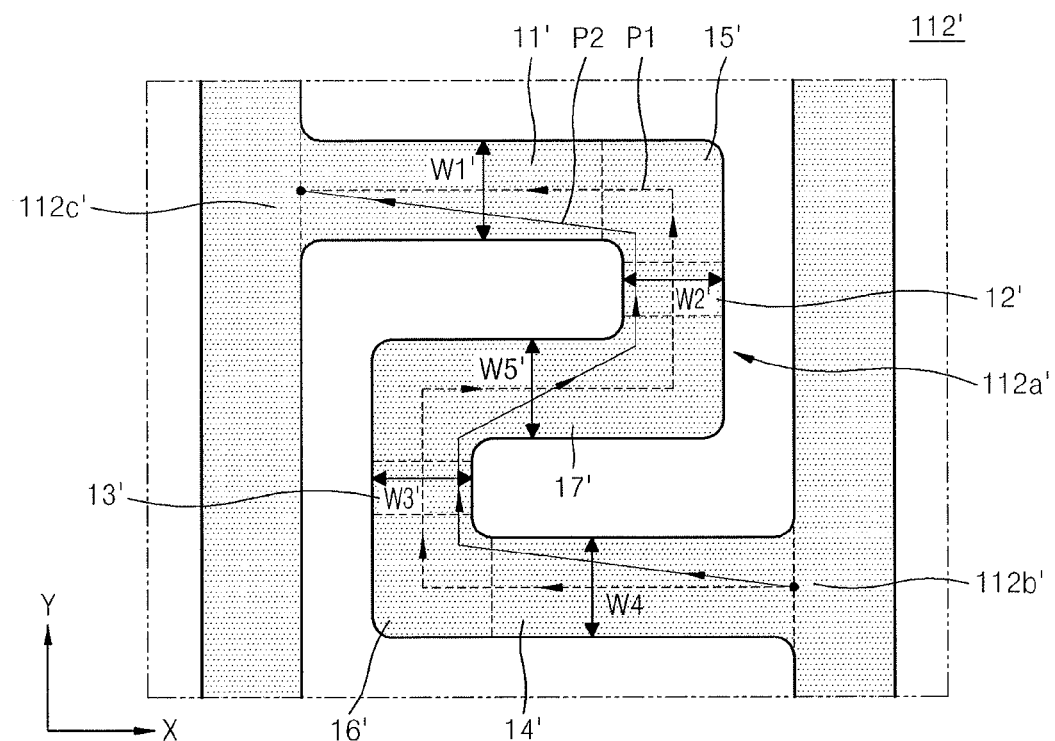
FIG. 13 illustrates a Comparative Examiner of a driving semiconductor layer.

FIG. 13 illustrates a pattern of a driving semiconductor layer 112' according to Comparative Example. When widths W1' through W4' of first through fourth regions 11' through 14' are the same (or substantially the same), and a space where the driving semiconductor layer 112' is disposed is small, an actual path of a current flowing from a driving source region 112b' to a driving drain region 112c' becomes P2 instead of P1. Consequently, the driving range in the semiconductor layer 112' may not be wide. A driving range may be further reduced if a space where a driving semiconductor layer is reduced.

However, when the overall width of a driving semiconductor layer is reduced, process variations tend to substantially increase. Thus, the quality of the display apparatus may deteriorate. One or more of the embodiments disclosed herein form a satisfactory current path in the driving channel region and also reduce process variations, thereby producing improved image quality from the display device.

Figure 4:
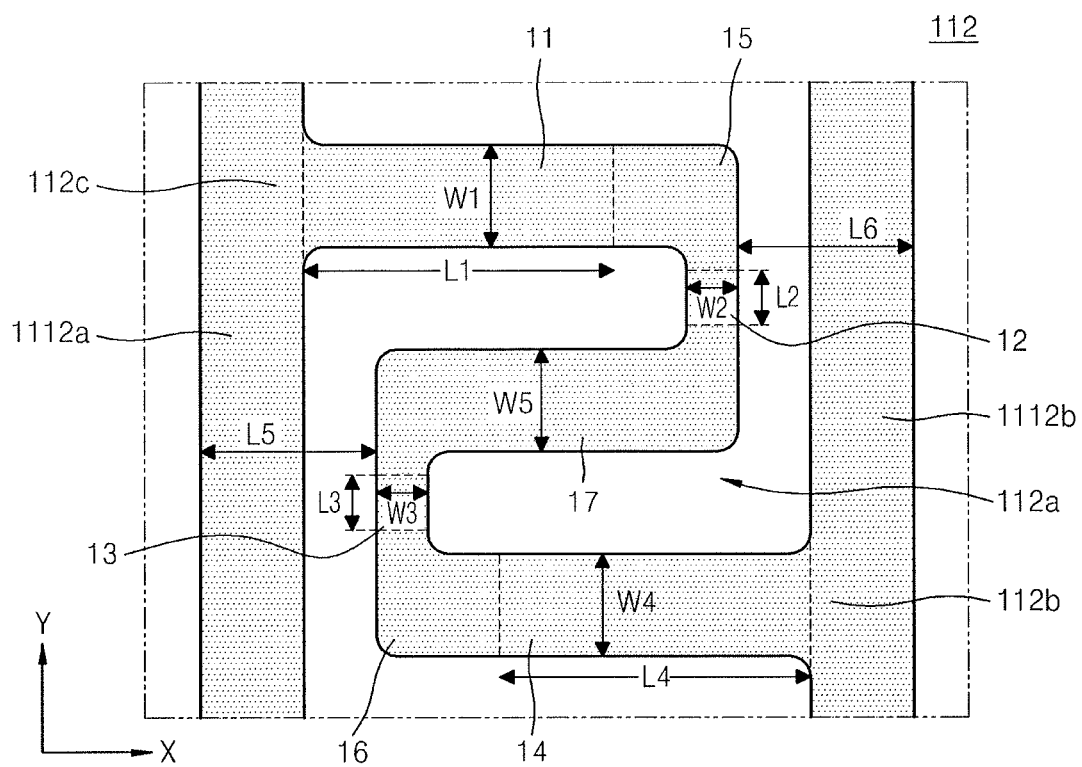
FIG. 4 illustrates region IV in FIG. 2.
Figure 5:
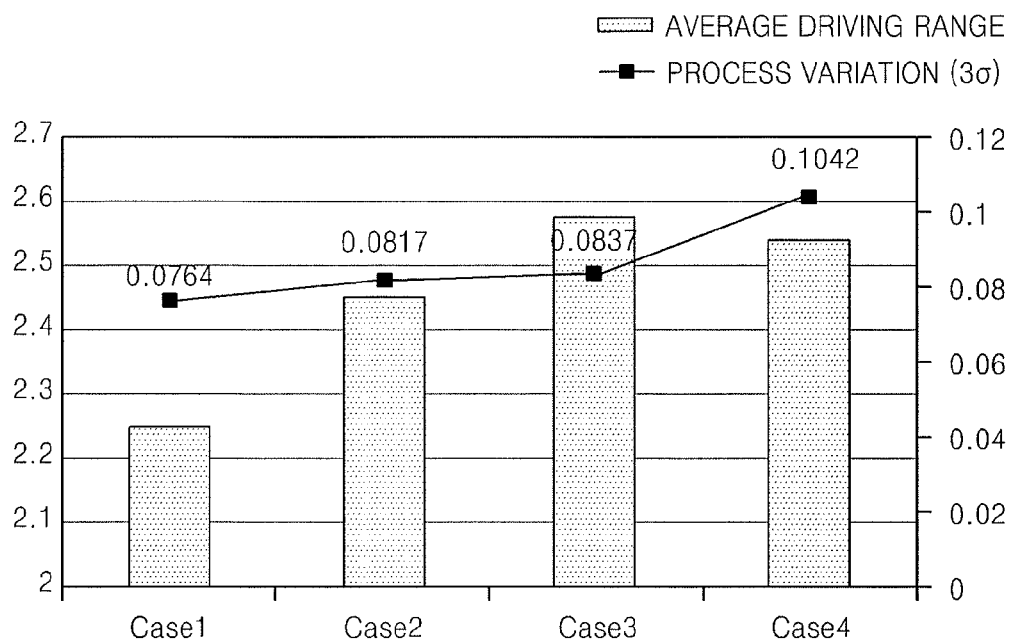
FIG. 5 illustrates examples of average driving range of a gate voltage and a process variation that may correspond to an embodiment of an OLED apparatus.

FIG. 4 is an enlarged view of region IV in FIG. 2, and FIG. 5 illustrates a non-limiting example of an average gate-voltage driving range and process variations according to a width of driving semiconductor layer 112.

Referring to FIG. 4, semiconductor layer 112 includes a first region 11 extending in a first (X) direction, a first curved portion 15 which curves at one end of the first region 11 to change direction, and a second region 12 extending in a second (Y) direction having one end connected to the first curved portion 15. The semiconductor layer 112 also includes a third region 13 extending in the second direction, a second curved portion 16 curved at one end of the third region 13 to change direction, a fourth region 14 extending in the first direction and having one end connected to the second curved portion 16, and a connecting portion 17 connecting the second and third regions 12 and 13. As shown in FIG. 4, widths W2 and W3 of the second and third regions 12 and 13 are narrower than widths W1 and W4 of the first and fourth regions 11 and 14.

The driving semiconductor layer 112 includes the driving channel region 112a, the driving source region 112b, and the driving drain region 112c. A region adjacent to the other end of the fourth region 14 corresponds to the driving source region 112b on which an impurity is doped. A region adjacent to the other end of the first region 11 corresponds to the driving drain region 112c, on which an impurity is doped. Accordingly, current may flow from the driving source region 112b to the driving drain region 112c through the driving channel region 112a.

According to this embodiment, the driving channel region 112a of the driving semiconductor layer 112 has a shape of "ㄹ." This shape allows the length of the driving channel region 112a through which current flows to be increased within a small space. As a result, the driving range of the gate voltage may be increased.

In one embodiment, the first and fourth regions 11 and 14 extending in the first direction X may have substantially the same widths W1 and W4. The second and third regions 12 and 13 extending in the second direction Y may have substantially the same widths W2 and W3. Also, the widths W1 and W4 of the first and fourth regions 11 and 14 may be wider than the widths W2 and W3 of the second and third regions 12 and 13. Also, lengths L1 and L4 of the first and fourth regions 11 and 14 may be longer than lengths L2 and L3 of the second and third regions 12 and 13.

The driving semiconductor layer 112 also includes connecting portion 17 which connects the second and third regions 12 and 13. The connecting portion 17 may include a region extending in the first direction X. In other words, an extending direction of the second and third regions 12 and 13 may be approximately perpendicular to an extending direction of the connecting portion 17 in one non-limiting embodiment.

The connecting portion 17 may have a width W5 which is substantially the same as the widths W1 and W4 of the first and fourth regions 11 and 14.

In other words, the region of driving semiconductor layer 112 extending in the second direction Y may have a narrow width. Thus an actual path of current flowing through the driving channel region 112a may be lengthened.

Figure 9:
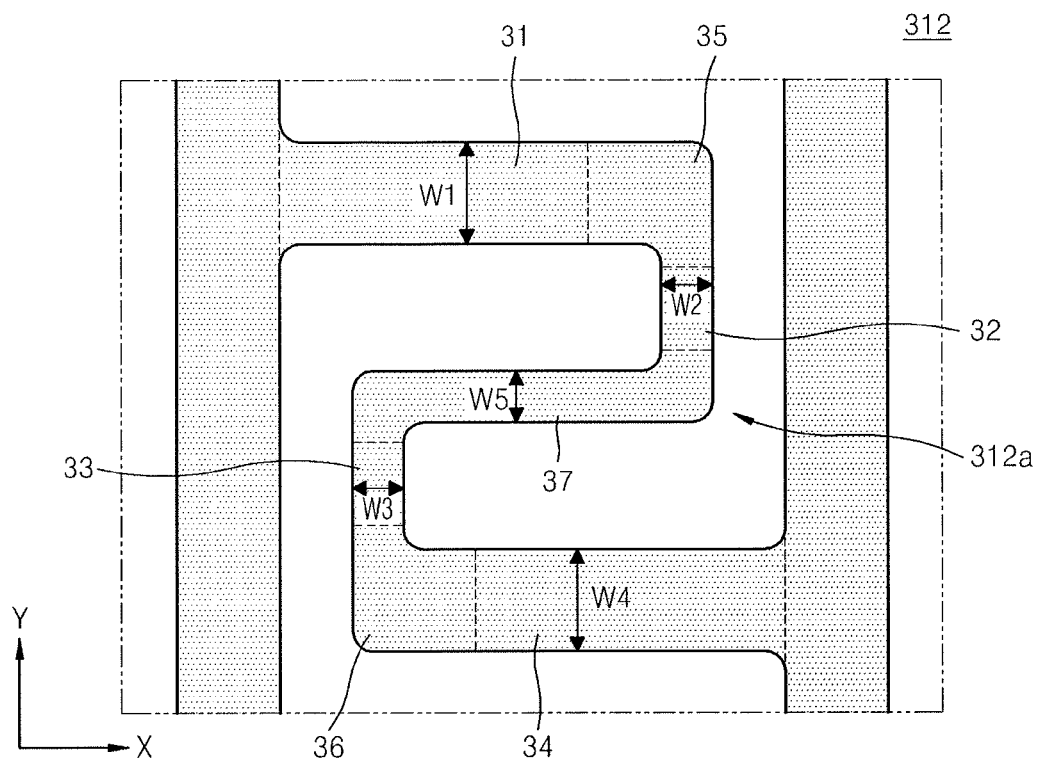
FIG. 9 illustrates another embodiment of a driving semiconductor layer of an OLED apparatus.

As shown in FIG. 9, current does not move along a center line of the driving channel region 112a, but tends to move in a shortest path within a defined region. Accordingly, by forming the region to extend in the second direction Y to be narrow according to the current embodiment, a path of a current may be prevented from being shortened, as current flows along an inner edge of the second and third regions 12 and 13. Thus, the length of the connecting portion 17 may be increased. In other words, the driving semiconductor layer 112 is disposed in a limited space for high resolution. The driving semiconductor layer 112 may have a curved shape (e.g., "ㄹ"), where the widths of one or more regions are formed to be narrower than the widths of one or more other regions. As a result, the driving range of the gate voltage is increased.

Also, because the second and third regions 12 and 13 have shorter lengths than the first and fourth regions 11 and 14 and do not have a curved portion, process variation may not be increased compared to when the widths W1 through W4 are the same. This is so even when the widths W2 and W3 of the second and third regions 12 and 13 are narrow.

Referring to FIG. 5, Case 1 corresponds to when widths of first through fourth regions are 3 μm. Case 2 correspond to when widths of first and fourth regions are 3 μm and widths of second and third regions are 2 μm. Case 3 corresponds to when widths of first and fourth regions are 3 μm and widths of second and third regions are 1.5 μm. Case 4 corresponds to when widths of first through fourth regions are 2 μm.

Also, in FIG. 5, the left vertical axis is a bar graph which denotes an average driving voltage [V] of a gate voltage. The right vertical graph corresponds to a line graph which denotes a deviation [V] of a driving voltage according to a process variation. From these graphs, when widths W2 and W3 of the second and third regions 12 and 13 are narrow as in the driving semiconductor layer 112 of the current embodiment, driving voltages increase up to about 9% (Case 2) and about 14% (Case 3), but process variation barely increases.

However, when overall widths of the driving semiconductor layer are decreased to 2 μm, the driving range increases but process variation remarkably increases according to the decreased overall width. The quality of images produced from the display device may therefore deteriorate.

Referring back to FIG. 4, the organic light-emitting display apparatus according to the current embodiment may include a first semiconductor pattern 1112a connected to the other end of the first region 11 in the driving semiconductor layer 112. A second semiconductor pattern 1112b is connected to the other end of the fourth region 14. The first and second semiconductor patterns 1112a and 1112b extend in the second direction Y.

In other words, semiconductor layer 1112 includes the driving semiconductor layer 112, the first semiconductor pattern 1112a, and the second semiconductor pattern 1112b. One region of each of the first and second semiconductor patterns 1112a and 1112b may be another TFT included in the organic light-emitting display apparatus, for example, a semiconductor layer of a switching TFT.

While forming the semiconductor layer 1112, adjacent lines are spaced from each other by a minimum or predetermined distance. Thus, a space where the driving semiconductor layer 112 is disposed may be determined by the first and second semiconductor patterns 1112a and 1112b.

In order to increase the space where the driving semiconductor layer 112 is disposed, the second and third regions 12 and 13 may be disposed to reduce a distance L5 between the first semiconductor pattern 1112a and the third region 13 and/or to reduce a distance L6 between the second semiconductor pattern 1112b and the second region 12. In other words, the distances L5 and L6 may be the same.

According to one embodiment, a minimum distance may be about 5 μm, where distance L5 denotes a distance between a side of the first semiconductor pattern 1112a opposite to a direction where the driving semiconductor layer 112 is disposed and an outer side of the third region 13. The distance L6 denotes a distance between a side of the second semiconductor pattern 1112b opposite to a direction where the driving semiconductor layer 112 is disposed and an outer side of the second region 12.

The first curved portion 15 changes direction by being curved at the end of the first region 11. The second curved portion 16 changes direction by being curved at the end of the third region 13. In other words, the first curved portion 15 connects the first and second regions 11 and 12, and the second curved portion 16 connects the third and fourth regions 13 and 14.

Figure 6:
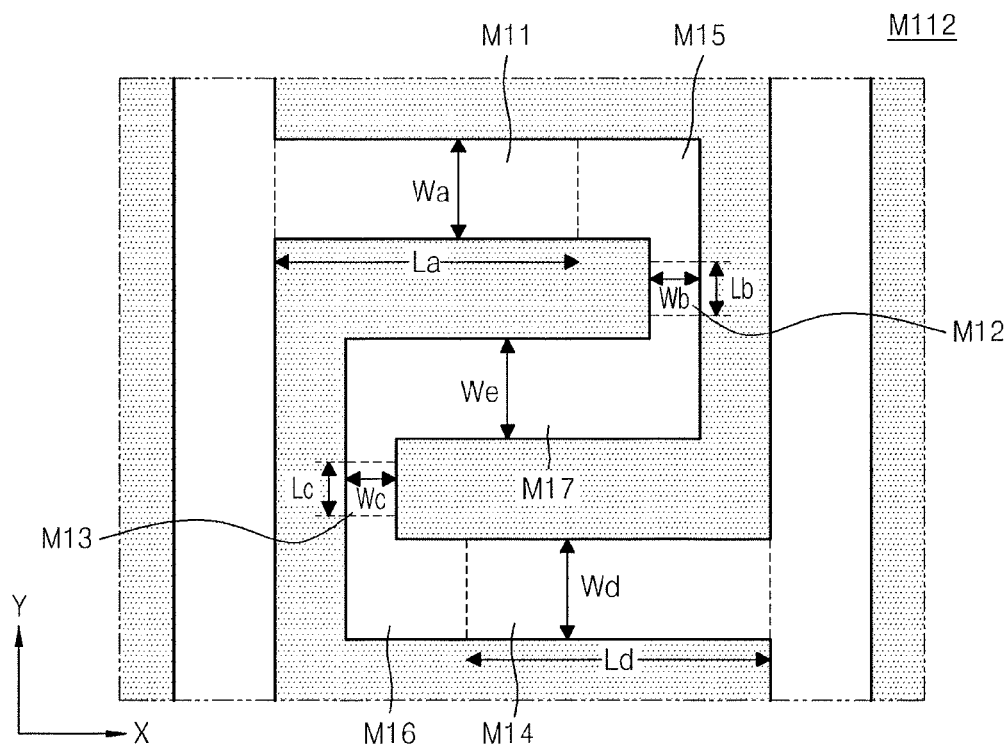
FIG. 6 illustrates an example of a photomask for preparing the pattern in FIG. 4.

FIG. 6 illustrates an example of a photomask for preparing the pattern shown in FIG. 4. Referring to FIG. 6, the photomask includes a switching opening pattern corresponding to a switching semiconductor layer, and a driving opening pattern M112 connected to the switching opening pattern and corresponding to the driving semiconductor layer 112.

The driving opening pattern M112 includes a first region M11 extending in the first direction X, a first corner portion M15 connected to one end of the first region M11 and which changes direction, a second region M12 extending in the second direction Y and having one end connected to the first corner portion M15, a third region M13 extending in the second direction Y, a second corner portion M16 connected to one end of the third region M13 and which changes direction, a fourth region M14 extending in the first direction X and having one end connected to the second corner portion M16, and a connecting portion M17 connecting the second and third regions M12 and M13. Widths Wb and Wc of the second and third regions M12 and M13 are narrower than widths Wa and Wd of the first and fourth regions Ml1 and M14.

Referring to the driving semiconductor layer 112 of FIG. 4, the first region 11, the second region 12, the third region 13, the fourth region 14, the first curved portion 15, the second curved portion 16, and the connecting portion 17 of the driving semiconductor layer 112 may respectively correspond to the first region M11, the second region M12, the third region M13, the fourth region M14, the first corner portion M15, the second corner portion M16, and the connecting portion M17 of the driving opening pattern M112.

The widths Wa and Wd of the first and fourth regions M11 and M14 extending in the first direction X may be substantially the same. The widths Wb and Wc of the second and third regions M12 and M13 extending in the second direction Y may be substantially the same. The widths Wa and Wd of the first and fourth regions M11 and M14 may be wider than the widths Wb and Wc of the second and third regions M12 and M13. Lengths La and Ld of the first and fourth regions M11 and M14 may be longer than lengths Lb and Lc of the second and third regions M12 and M13.

The widths Wa through Wd of the first through fourth regions M11 through M14 may respectively correspond to the widths W1 through W4 of the first through fourth regions 11 through 14 of the driving semiconductor layer 112. These widths may have substantially have the same value within an error range during a patterning process.

The driving opening pattern M112 according to the current embodiment includes connecting portion M17 connecting the second and third regions M12 and M13. The connecting portion M17 may include a region extending in the first direction X. In other words, an extending direction of the second and third regions M12 and M13 may be approximately perpendicular to an extending direction of the connecting portion M17. The connecting portion M17 may have a width Wc which may be substantially the same as the widths Wa and Wd of the first and fourth regions M11 and M14.

Figure 7:
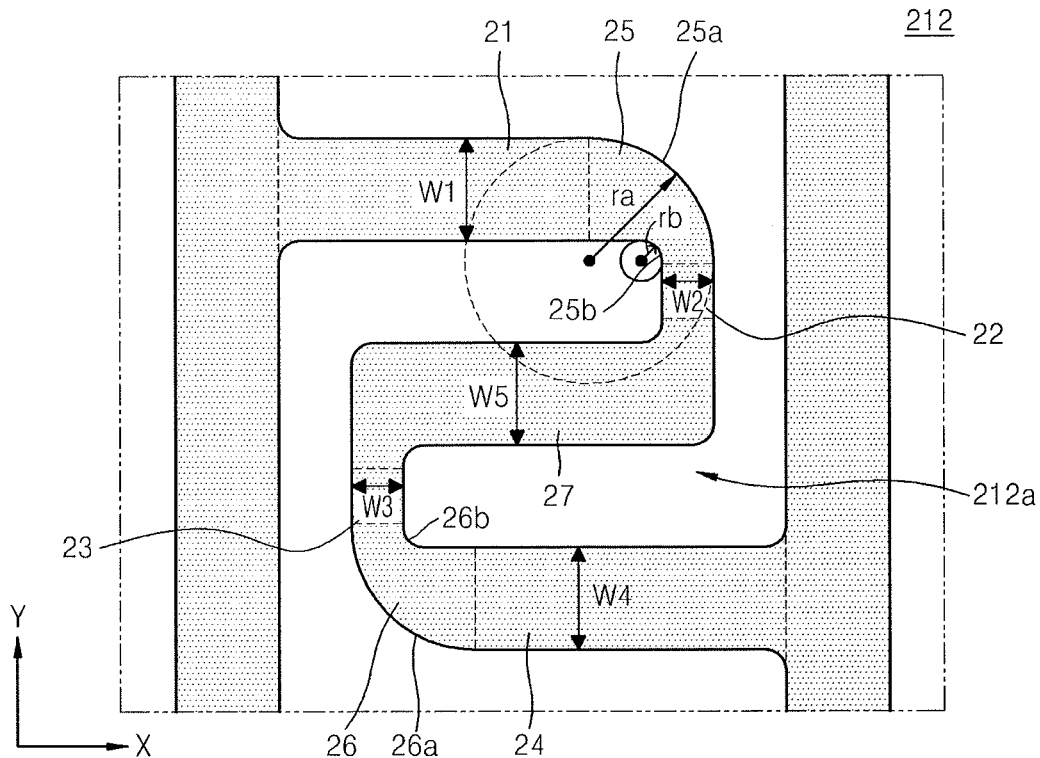
FIG. 7 illustrates an embodiment of a driving semiconductor layer of an OLED apparatus.
Figure 8:
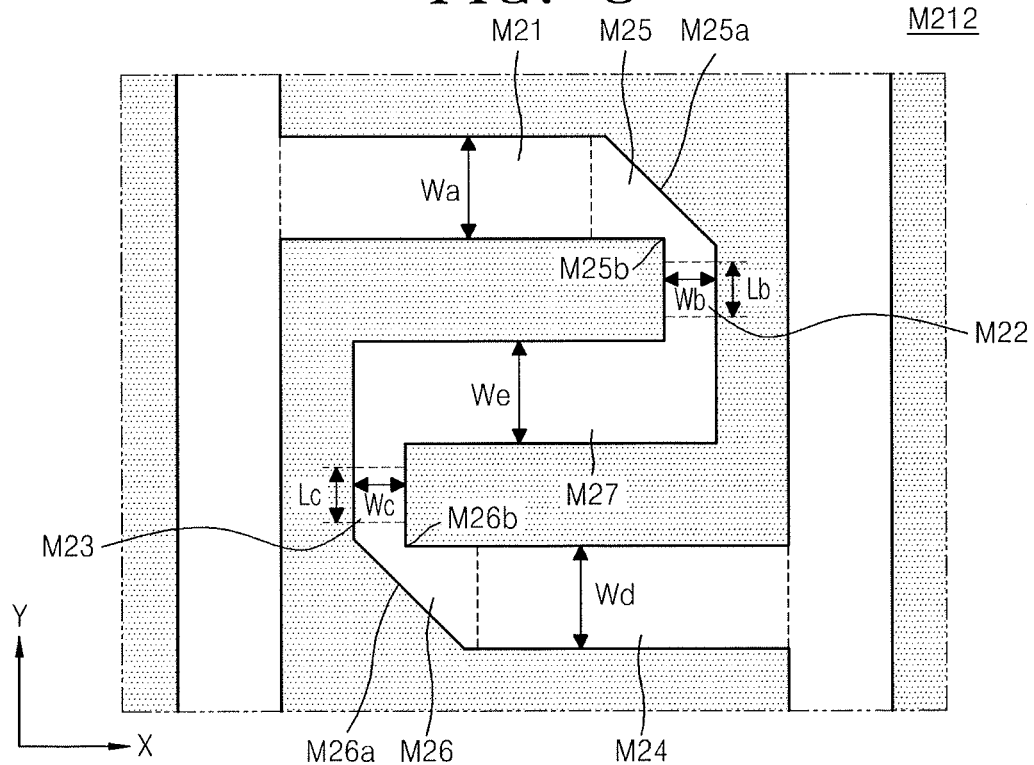
FIG. 8 illustrates an example of a photomask for preparing the pattern in FIG. 7.

FIG. 7 illustrates another embodiment of a driving semiconductor layer 212 of an organic light-emitting display apparatus, and FIG. 8 illustrates an example of a photomask for preparing a pattern shown in FIG. 7.

Referring to FIG. 7, the driving semiconductor layer 212 includes a first region 21 extending in the first direction X, a first curved portion 25 curved at one end of the first region 21 and which changes direction, a second region 22 extending in the second direction Y and having one end is connected to the first curved portion 25, a third region 23 extending in the second direction Y, a second curved portion 26 curved at one end of the third region 23 and which changes direction, a fourth region 24 extending in the first direction X and having one end connected to the second curved portion 26, and a connecting portion 27 connecting the second and third regions 22 and 23. The widths W2 and W3 of the second and third regions 22 and 23 are narrower than widths W1 and W4 of the first and fourth regions 21 and 24.

The driving semiconductor layer 212 is different from the driving semiconductor layer 112 of FIG. 4 in the first and second curved portions 25 and 26. In other words, the first and second curved portions 25 and 26 respectively include outer corners 25a and 26a, and inner corners 25b and 26b respectively corresponding to the outer corners 25a and 26a. Radii of curvatures ra of the outer corners 25a and 26a are higher than radii of curvatures rb of the inner corners 25b and 26b. (A radius of curvature denotes a curvature of a curved surface or a curved line). When the radius of curvature is high, the curvature is gradual. Accordingly, the outer corners 25a and 26a are more gradually curved than the inner corners 25b and 26b.

By gradually forming the outer corners 25a and 26a of the first and second curved portions 25 and 26 of the driving semiconductor layer 212, process variations (e.g. process dispersion and error) that may occur while preparing driving semiconductor layer 212 may be reduced. Also, since current flowing through the first and second curved portions 25 and 26 in a driving channel region 212a is biased in a direction of the inner corners 25b and 26b, a space where the current does not flow may be removed, thereby making efficient use of space.

FIG. 8 illustrates an example of a photomask for forming the driving semiconductor layer 212 of FIG. 7. The driving opening pattern M112 of the photomask includes a first region M21 extending in the first direction X, a first corner portion M25 connected to one end of the first region M21 and which changes direction, a second region M22 connected to the first corner portion M25 and extending in the second direction Y, a third region M23 extending in the second direction, a second corner portion M26 connected to one end of the third region M23 and which changes direction, a fourth region M24 connected to the second corner portion M26 and extending in the first direction X, and a connecting portion M27 connecting the second and third region M22 and M23. The widths Wb and Wc of the second and third regions M22 and M23 are narrower than widths Wa and Wd of the first and fourth regions M21 and M24.

A driving opening pattern M212 is different from the driving opening pattern M112 of FIG. 6 in the first and second corner portions M25 and M26. In other words, the first and second corner portions M25 and M26 respectively include outer corners M25a and M26a, and inner corners M25b and M26b respectively corresponding to the outer corners M25a and M26a. The outer corners M25a and M26a may be chamfered, e.g., an edge or corner is obliquely cut to form a slope or a round shape. By chamfering the outer corners M25a and M26a of the driving opening pattern M212, outer corners 25a and 26b of the driving semiconductor layer 212 of FIG. 7 may be formed to gradually curve using the driving opening pattern M212.

Figure 10:
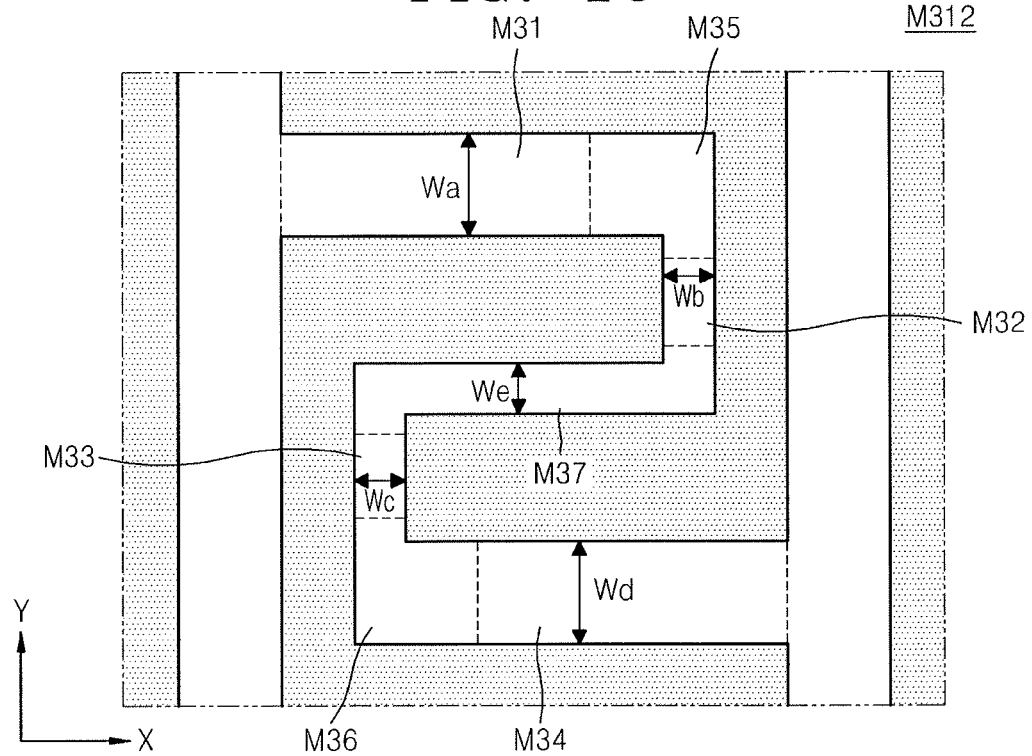
FIG. 10 illustrates an example of a photomask for preparing the pattern in FIG. 9.

FIG. 9 illustrates another embodiment of a driving semiconductor layer 312 of an organic light-emitting display apparatus, and FIG. 10 illustrates an example of a photomask for preparing a pattern shown in FIG. 9.

Referring to FIG. 9, the driving semiconductor layer 312 includes a first region 31 extending in the first direction X, a first curved portion 35 curved at one end of the first region 31 and which changes direction, a second region 32 extending in the second direction Y and having one end connected to the first curved portion 35, a third region 33 extending in the second direction Y, a second curved portion 36 curved at one end of the third region 33 and which changes direction, a fourth region 34 extending in the first direction X and having one end is connected to the second curved portion 36, and a connecting portion 37 connecting the second and third regions 32 and 33. The widths W2 and W3 of the second and third regions 32 and 33 are narrower than widths W1 and W4 of the first and fourth regions 31 and 34.

Driving semiconductor layer 312 is different from the driving semiconductor layer 112 of FIG. 4 in the connecting portion 37. In other words, the widths W2 and W3 of the second and third regions 32 and 33 may be substantially the same, and a width W5 of the connecting portion 37 may be substantially the same as the widths W2 and W3 of the second and third regions 32 and 33.

By forming the width W5 of the connecting portion 37 to be narrow, current flowing through driving channel region 312a of driving semiconductor layer 312 may be prevented from flowing through a shortest path in a connecting portion having a wide width. Thus, the moving path of the current may be further increased.

FIG. 10 illustrates an example of a photomask for forming the driving semiconductor layer 312 of FIG. 9. A driving opening pattern M312 of the photomask includes a first region M31 extending in the first direction X, a first corner portion M35 connected to one end of the first region M31 and which changes direction, a second region M32 connected to the first corner portion M35 and extending in the second direction Y, a third region M33 extending in the second direction Y, a second corner portion M36 connected to one end of the third region M33 and which changes a direction, a fourth region M34 connected to the second corner portion M36 and extending in the first direction X, and a connecting portion M37 connecting the second and third region M32 and M33. The widths Wb and Wc of the second and third regions M32 and M33 are narrower than widths Wa and Wd of the first and fourth regions M31 and M34.

The widths Wb and Wc of the second and third regions M32 and M33 may be substantially the same. A width We of the connecting portion M37 may be substantially the same as the widths Wb and Wc of the second and third regions M32 and M33. The width We of the connecting portion M37 corresponds to the width W5 of the connecting portion 37 in driving semiconductor layer 312 of FIG. 9, and may have the same value within a process error range.

Figure 11:
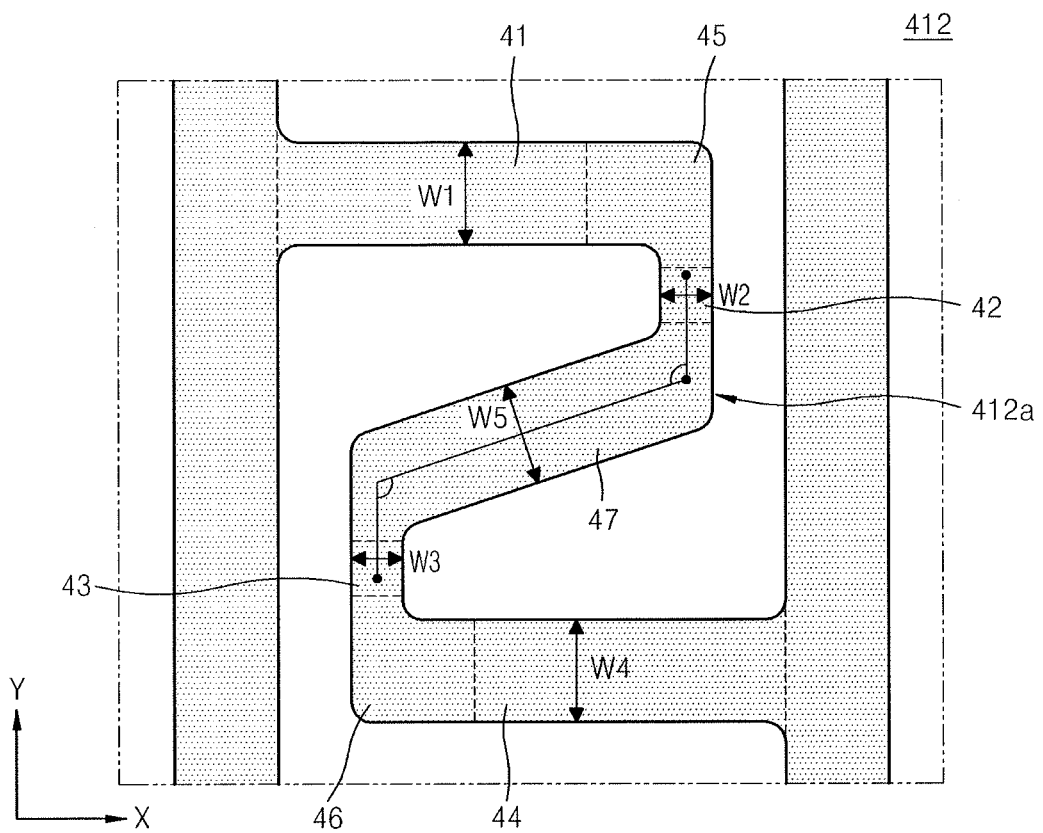
FIG. 11 illustrates another embodiment of a driving semiconductor layer of an OLED apparatus.
Figure 12:
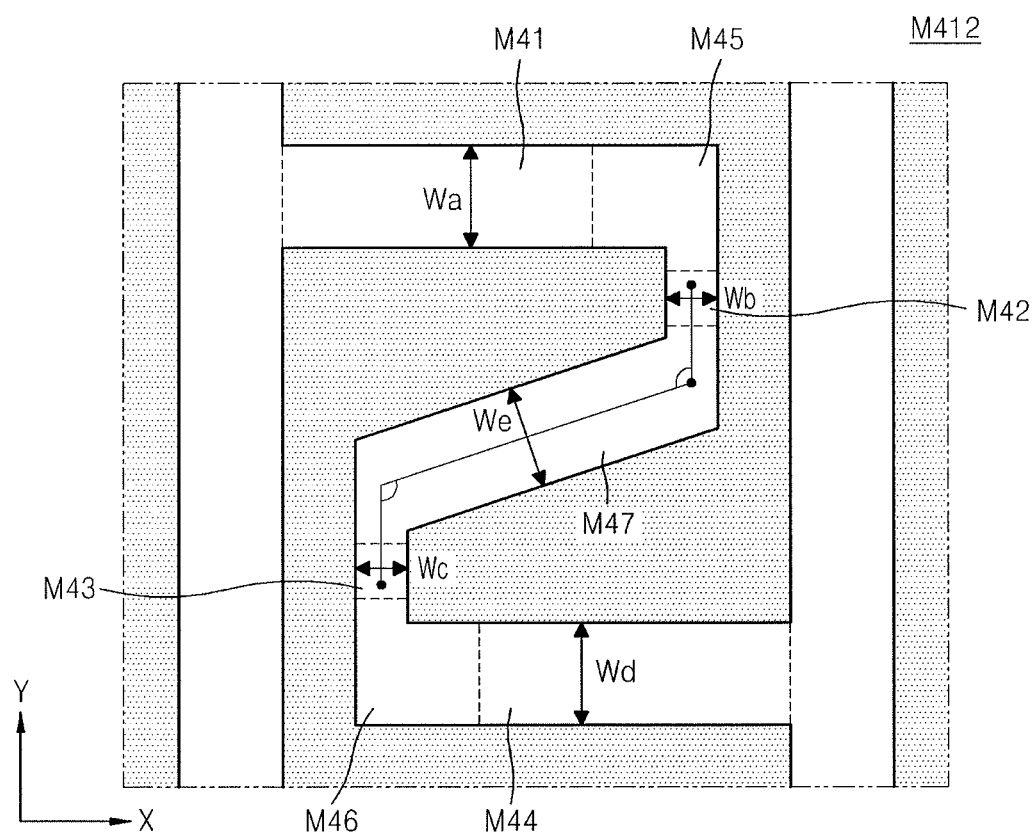
FIG. 12 illustrates an example of a photomask for preparing the pattern in FIG. 11.

FIG. 11 illustrates another embodiment of a driving semiconductor layer 412 of an organic light-emitting display apparatus, and FIG. 12 illustrates an example of a photomask for preparing a pattern in FIG. 11.

Referring to FIG. 11, driving semiconductor layer 412 includes a first region 41 extending in the first direction X, a first curved portion 45 curved at one end of the first region 41 and which changes direction, a second region 42 extending in the second direction Y and having one end is connected to the first curved portion 45, a third region 43 extending in the second direction Y, a second curved portion 46 curved at one end of the third region 43 and which changes direction, a fourth region 44 extending in the first direction X and having one end connected to the second curved portion 46, and a connecting portion 47 connecting the second and third regions 42 and 43. The widths W2 and W3 of the second and third regions 42 and 43 are narrower than widths W1 and W4 of the first and fourth regions 41 and 44.

The driving semiconductor layer 412 is different from the driving semiconductor layer 112 of FIG. 4 in the connecting portion 47. That is, connecting portion 47 may extend to form an obtuse angle relative to each of the second and third regions 42 and 43. In other words, the connecting portion 47 includes a linear portion which has a center axis that forms an obtuse angle with a center axis of the second region 42 and which forms an obtuse angle with a center axis of third region 43. Accordingly, the connecting portion 47 is disposed in an oblique line with respect to the second direction Y to connect the second and third regions 42 and 43.

Also, in this embodiment, a sufficient length of a driving channel region 412a of the driving semiconductor layer 412 is obtained when a space where driving semiconductor layer 412 is disposed is narrow in the first direction X and is spaced in the second direction Y. Thus, the driving range of the gate electrode is increased. Also, since curves of a region where the second region 42 and the connecting portion 47 are connected and of a region where the third region 43 and the connecting portion 47 are connected are gradual, process variations (e.g. process deviation and error) may be reduced.

FIG. 12 illustrates an example of a photomask for forming driving semiconductor layer 412 of FIG. 11. As shown in FIG. 12, driving opening pattern M412 of the photomask includes a first region M41 extending in the first direction X, a first corner portion M45 connected to one end of the first region M41 and which changes direction, a second region M42 connected to the first corner portion M45 and extending in the second direction Y, a third region M43 extending in the second direction Y, a second corner portion M46 connected to one end of the third region M43 and which changes direction, a fourth region M44 connected to the second corner portion M46 and extending in the first direction X, and a connecting portion M47 connecting the second and third region M42 and M43. The widths Wb and Wc of the second and third regions M42 and M43 are narrower than widths Wa and Wd of the first and fourth regions M41 and M44.

The connecting portion M47 may extend to have an obtuse angle relative to each of the second and third regions M42 and M43. Thus, the connecting portion M47 may be suitable for obtaining a long driving channel length in a limited space in the first direction X.

FIG. 13 illustrates a driving semiconductor layer 112' according to Comparative Example. Referring to FIG. 13, the driving semiconductor layer 112' includes first region 11' extending in the first direction X, second region 13' extending in the second direction Y, third region 13' extending in the second direction Y, and fourth region 14' extending in the first direction X. The widths W1' through W4' of the first through fourth regions 11' through 14' are substantially the same.

Moreover, driving semiconductor layer 112' has a shape of "ㄹ" and thus has a driving channel region with a long length. However, when a space where the driving semiconductor layer 112' is disposed is small, the current path is P2 instead of P1, i.e., the current path P2 is shorter than a desired current path P1. Thus, the driving range may not be increased.

Also, when the space of the driving semiconductor layer is further decreased, the driving range may be further decreased. Also, when the overall width of the driving semiconductor layer is reduced to prevent a small driving range, process variations are significantly increased, as previously described with reference to FIG. 5. Thus, the quality of images displayed by the display device may be deteriorated.

In contrast, according to the aforementioned embodiments illustrated in FIGS. 4, 7, 9, and 11, the width of the region extending in the second direction Y is decreased. As a result, the driving range of a gate voltage is increased because the actual current path is increased. As a result, process variation is decreased to thereby produce a display device that is able to generate images of improved quality. Also, according to one or more of the above embodiments, an organic light-emitting display apparatus may be provided to have a small dispersion and a wide driving range.

Also, while many of the aforementioned embodiments have been described relative to an OLED display device, other embodiments may be applied to other types of display devices including but not limited to liquid crystal display devices.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display apparatus comprising:
   a switching thin-film transistor (TFT) on a substrate and connected to a scan line and a data line;
   a driving TFT connected to the switching TFT; and
   a display device connected to the driving TFT, wherein the driving TFT includes a driving semiconductor layer which includes:
      a first region extending in a first direction;
      a first curved portion curved at an end of the first region and which changes direction;
      a second region extending in a second direction and having an end connected to the first curved portion;
      a third region extending in the second direction;
      a second curved portion curved at an end of the third region and which changes direction;
      a fourth region extending in the first direction and having an end connected to the second curved portion; and
      a connecting region to connect the second and third regions, and wherein widths of the second and third regions are narrower than widths of the first and fourth regions.
2. The apparatus as claimed in claim 1, wherein the widths of the first and fourth regions are substantially equal.
3. The apparatus as claimed in claim 1, wherein the widths of the second and third regions are substantially equal.
4. The apparatus as claimed in claim 1, wherein the connecting region includes a region extending in the first direction.
5. The apparatus as claimed in claim 1, wherein the connecting region extends to form an obtuse angle relative to each of the second and third regions.
6. The apparatus as claimed in claim 1, wherein:
   each of the first and second curved portions includes an inner corner corresponding to an outer corner, and
   a radius of curvature of the outer corner is greater than a radius of curvature of the inner corner.
7. The apparatus as claimed in claim 1, wherein lengths of the first and fourth regions are longer than lengths of the second and third regions.
8. The apparatus as claimed in claim 1, further comprising:
   a first semiconductor pattern connected to another end of the first region and extending in the second direction; and
   a second semiconductor pattern connected to another end of the fourth region and extending in the second direction.

9. The apparatus as claimed in claim 8, wherein a distance between the first semiconductor pattern and the third region is substantially equal to a distance between the second semiconductor pattern and the second region.

10. The apparatus as claimed in claim 1, further comprising:
   a first insulating film on the substrate and overlapping the driving semiconductor layer; and
   a capacitor on the first insulating film and overlapping the driving semiconductor layer.

11. The apparatus as claimed in claim 10, wherein the capacitor comprises:
   a first electrode on the first insulating film, overlapping the driving semiconductor layer, and performing functions of a driving gate electrode;
   a second insulating film overlapping the first electrode; and
   a second electrode on the second insulating film and overlapping the first electrode.

12. The apparatus as claimed in claim 1, wherein the display device is an organic light-emitting device which includes an organic emission layer between first and second electrodes.

13. A semiconductor device, comprising:
   a substrate; and
   a semiconductor layer including:
   a first region extending in a first direction;
   a first curved portion curved at an end of the first region and which changes direction;
   a second region extending in a second direction and having an end connected to the first curved portion;
   a third region extending in the second direction;
   a second curved portion curved at an end of the third region and which changes direction;
   a fourth region extending in the first direction and having an end connected to the second curved portion; and
   a connecting region to connect the second and third regions, and wherein widths of the second and third regions are narrower than widths of the first and fourth regions.

* * * * *